United States Patent [19]

Hamby

[11] Patent Number: 4,687,695
[45] Date of Patent: Aug. 18, 1987

[54] FLEXIBLE PRINTED CIRCUITS AND METHODS OF FABRICATING AND FORMING PLATED THRU-HOLES THEREIN

[76] Inventor: Bill L. Hamby, 1198 Navigator Dr., Ventura, Calif. 93003

[21] Appl. No.: 780,806

[22] Filed: Sep. 27, 1985

[51] Int. Cl.⁴ .................... B32B 23/02; H05K 1/00
[52] U.S. Cl. ................................ 428/192; 428/901; 174/68.5
[58] Field of Search ............... 428/901, 192; 361/398; 156/275.5; 29/852; 228/248; 174/68.5

[56] References Cited

U.S. PATENT DOCUMENTS

| | | | |
|---|---|---|---|
| 3,926,360 | 12/1975 | Meister, Jr. | 228/180 |
| 4,012,307 | 3/1977 | Phillips | 204/192 E |
| 4,053,370 | 10/1977 | Yamashita et al. | 204/13 |
| 4,107,837 | 8/1978 | Chang | 29/625 |
| 4,215,387 | 7/1980 | Negishi et al. | 361/398 |
| 4,268,339 | 5/1981 | Urban | 156/272 |
| 4,338,149 | 7/1982 | Quaschner | 156/248 |
| 4,364,619 | 12/1982 | Inayat-Kahn | 339/17 F |
| 4,509,095 | 4/1985 | Boros | 174/84 R |
| 4,533,787 | 8/1985 | Anderegg et al. | 174/68.5 |

Primary Examiner—John L. Goodrow
Assistant Examiner—Patrick J. Ryan
Attorney, Agent, or Firm—Blakely, Sokoloff, Taylor & Zafman

[57] ABSTRACT

Flexible printed circuits and methods of fabricating and forming plated thru-holes therein are disclosed. The flexible printed circuits have one or more substantially rigid regions where plated thru-holes are to be formed, the regions being made rigid by the substitution of epoxy glass or other conventional rigid printed circuit board materials in place of the flexible material used for the flexible portions of the circuit. In this manner the thru-holes are formed through conventional printed circuit board layers, allowing plating of the thru-holes using conventional well developed techniques. This process avoids the necessity of plating thru-holes in flexible printed circuit materials currently requiring special equipment and techniques, and further avoids stress concentration at the junction between the rigid plated thru-holes and the adjacent flexible printed circuit. Various methods for forming such circuits and circuits so formed are disclosed.

20 Claims, 16 Drawing Figures

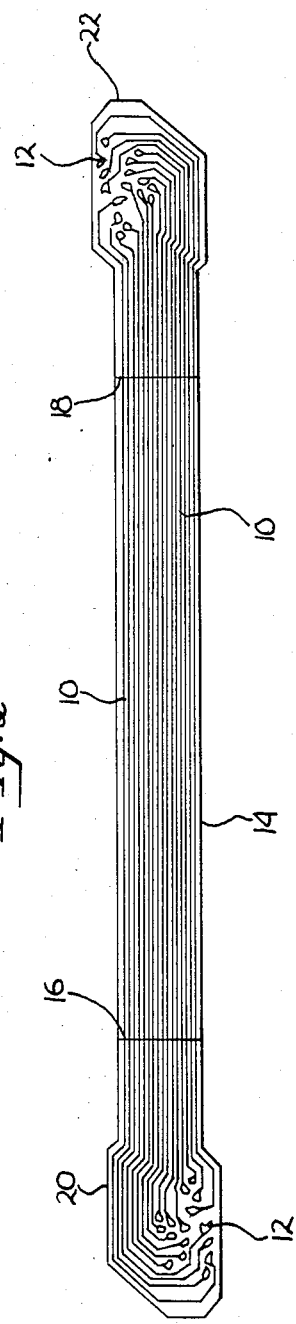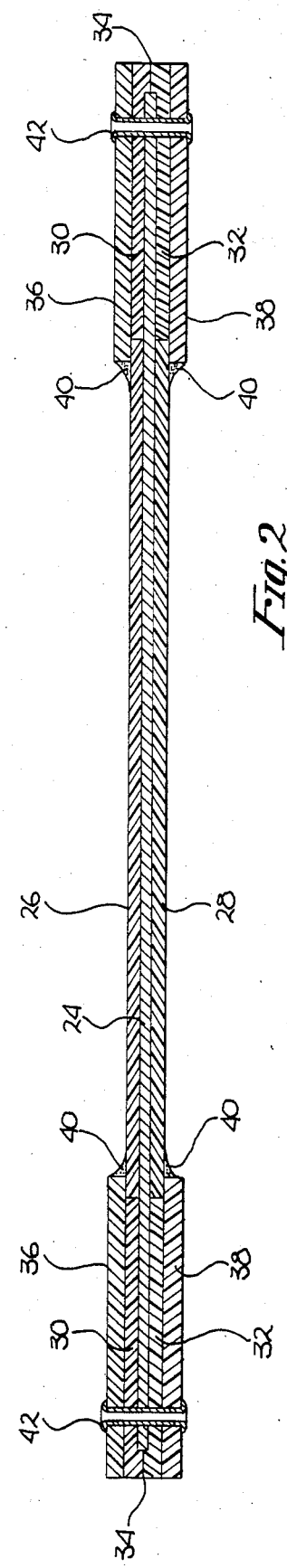

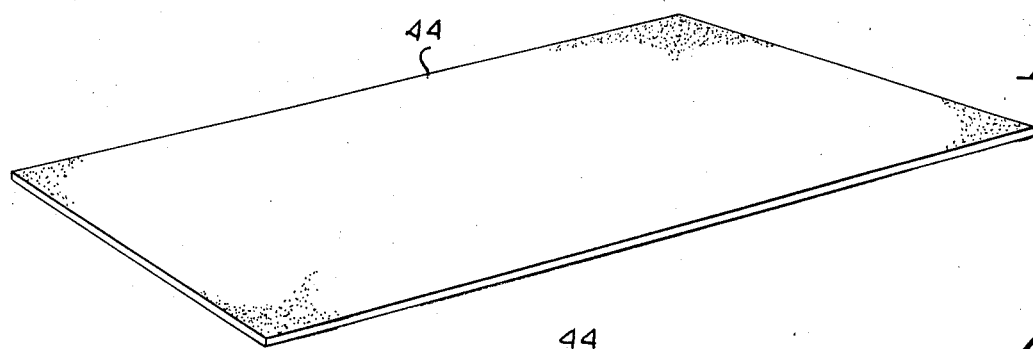
Fig.3
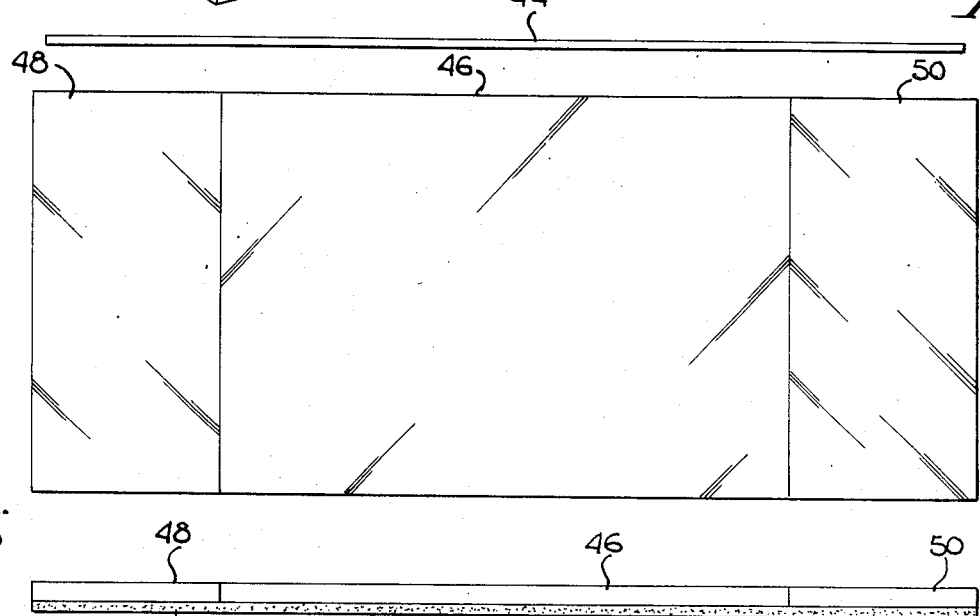
Fig.4
Fig.5
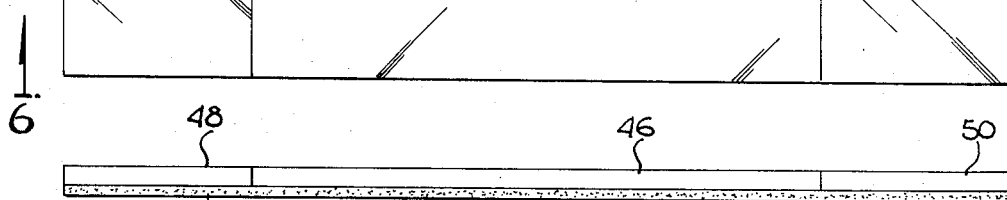
Fig.6
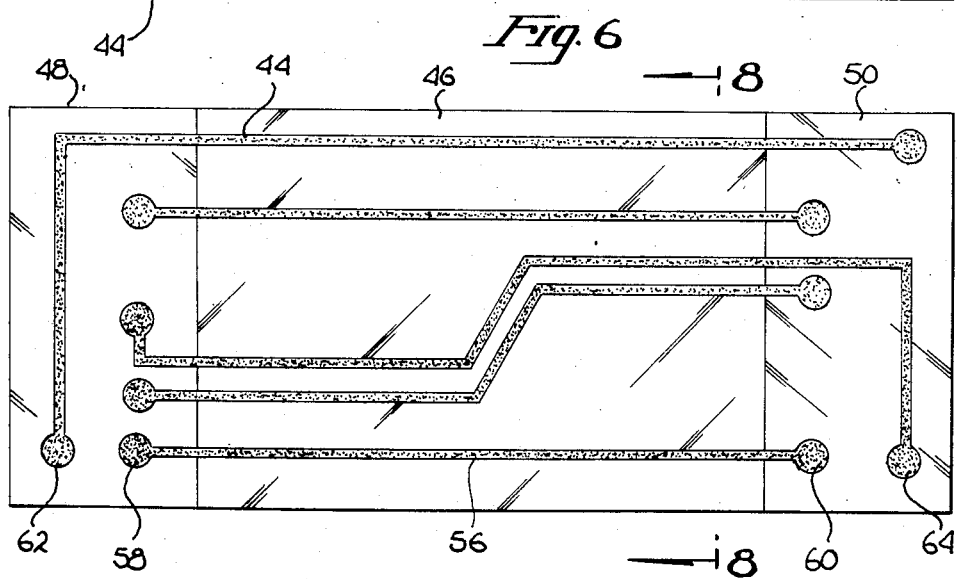
Fig.7
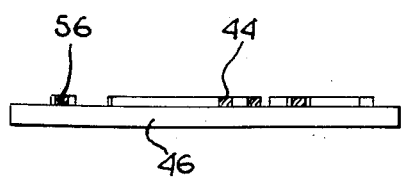
Fig.8

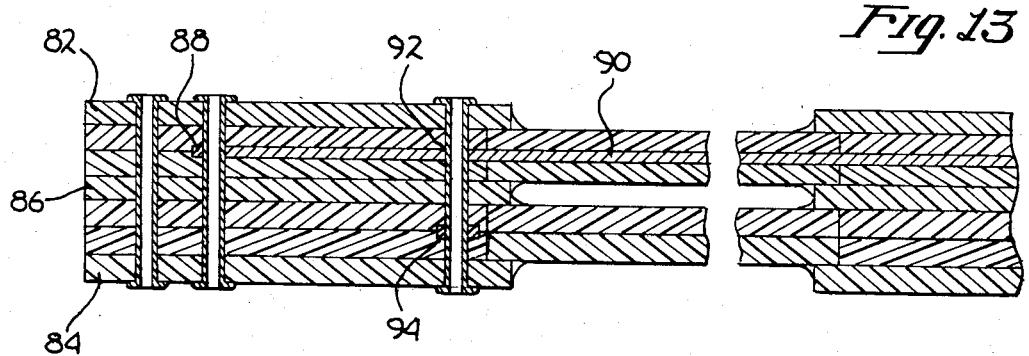
Fig. 13
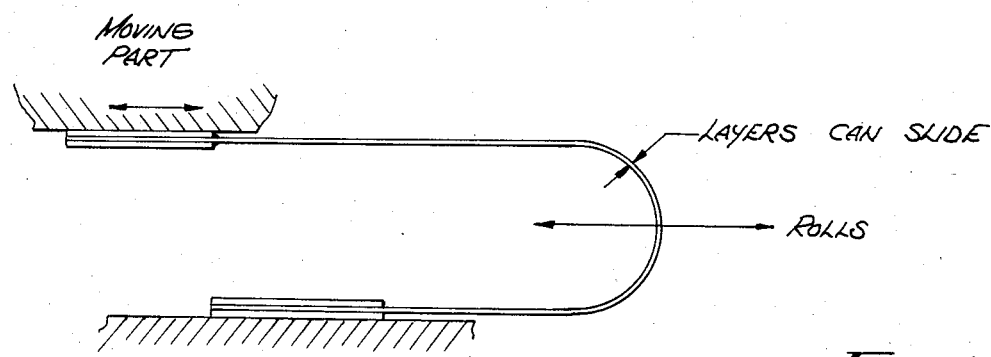
Fig. 14
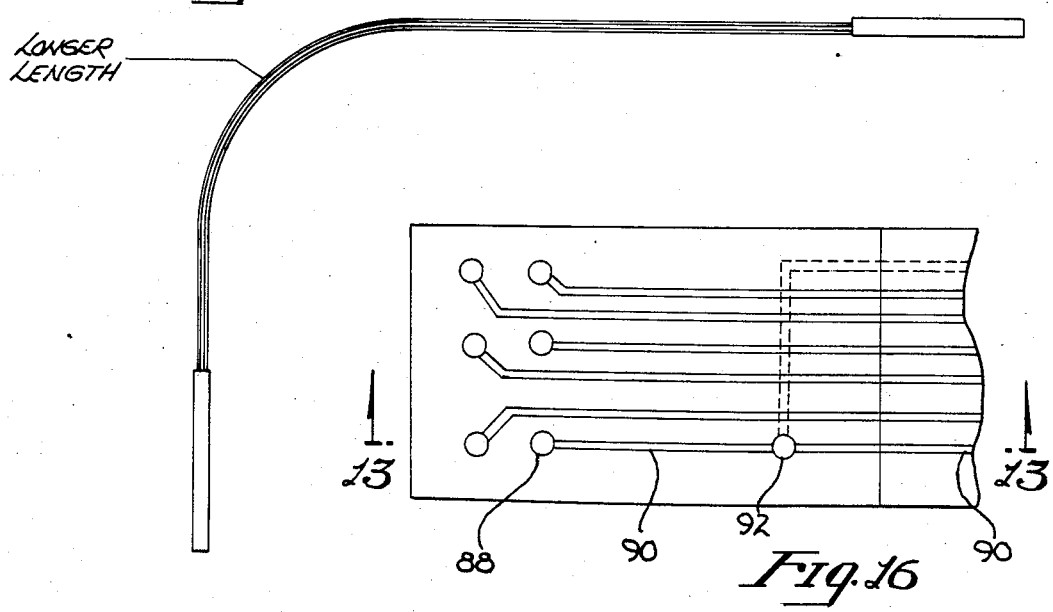
Fig. 15
Fig. 16

FLEXIBLE PRINTED CIRCUITS AND METHODS OF FABRICATING AND FORMING PLATED THRU-HOLES THEREIN

BACKGROUND OF THE INVENTION

1. Field of the Invention

The present invention relates to the field of flexible printed circuits.

2. Prior Art

Flexible printed circuits are now well known and are finding increased application in various types of products. Such circuits provide excellent flexibility and fatigue life, being ideal for applications where flexing throughout the service life of the circuit is a functional requirement, as well as applications where flexing is a requirement primarily to facilitate assembly and disassembly, to accommodate dimensional variations, etc. By way of example, flexible printed circuits formed in a rolling loop are commonly used for coupling printhead drive signals to the reciprocating printhead of dot matrix and other types of printers. Typical applications where flexibility is primarily required to facilitate assembly and disassembly include the use of the flexible printed circuit in place of a wire harness, as a flexible printed circuit provides the same function with reduced weight, greater flexibility and greater reliability, and with controlled and repeatable coupling between lines, an important consideration whenever signals which may include high frequency components are to be coupled through the circuit.

Conventional flexible printed circuit materials include as the flexible plastic film Kapton, Nomex and Teflon (trademarks of DuPont). These materials provide excellent flexibility, stability and heat resistance, and are now readily bondable to copper sheets for the formation of the printed circuit, and to themselves to provide an insulating layer for the printed circuit and/or to facilitate the construction of multilayer boards. These materials however, are very difficult to plate, and accordingly present special problems when one attempts to form interconnects between layers of the printed circuit. In particular, in conventional printed circuit board fabrication, interconnects between layers are generally formed by drilling thru-holes through pads of the layers to be interconnected, and of course all substrates aligned therewith, providing a flash of electroless plating through the thru-hole, and then electroplating through the thru-hole to provide the interconnect. The flexible printed circuit materials however, cannot be electroless plated without special preparation of the material, which of course must be done after the thru-hole is drilled, as it is the fresh material exposed by the drilling operation which must be plated. Accordingly, the formation of plated thru-holes in flexible printed circuits is an expensive, time-consuming operation, generally requiring special equipment and skills. In addition, because this technology is relatively new, it is not nearly as well developed as is the formation of plated thru-holes in conventional printed circuit boards, and therefore the results are sometimes less than desired in spite of the special processing used.

As an alternative to the use of plated thru-holes in flexible printed circuits, eyelets are sometimes used whereby the eyelets are inserted through the drilled thru-holes and flared, the eyelets making electrical contact to the exposed copper at each side of the board, the integrity of which contact is assured by soldering each side of the eyelet to the associated printed circuit. While the use of the eyelet eliminates the problem of forming plated thru-holes, insertion and flaring of the eyelets is itself a time-consuming process, and of course connection to any intermediate printed circuit layers in a multilayer flexible printed circuit can only be achieved through the use of eyelets by removing all layers thereabove at some stage of the manufacturing process prior to insertion of the eyelet and flaring and soldering thereof. At best, eyelets also tend to be relatively large in comparison to printed circuit line widths, etc. of circuits made in flexible form, and both eyelets and plated thru-holes have the disadvantage of creating a local rigid spot in an otherwise flexible sheet, tending to concentrate stresses during flexing of the circuit at the junction between the rigid spot and the adjacent flexible circuit.

U.S. Pat. No. 4,338,149 discloses a process for making circuit boards having rigid and flexible areas. The resulting circuit is comprised of the thin flexible layers in both the flexible and rigid portions of the circuit, the rigid portions being made rigid by additional rigid layers bonded thereto. Thus any thru-holes through the rigid portions necessarily pass through the flexible layers (e.g., flexible materials bonded as part of the sandwich) and accordingly the same interconnect problem exists as heretofore discussed.

In U.S. Pat. No. 4,318,954, printed wiring board substrates for ceramic chip carriers are disclosed. The problem addressed by that invention is the differential thermal expansion between conventional printed circuit boards and ceramic chip carriers. In order to reduce the coefficient of thermal expansion in the plane of the circuit board, a graphite reinforced support member is sandwiched between board layers to constrain the expansion rate of the sandwich in the plane of the circuit board. Because the graphite reinforced support member is electrically conductive, it is necessary to insulate the support member from a plated thru-hole. This is accomplished by drilling an oversized hole in the support member and filling the perimeter of the hole with an electrically nonconductive filler, such as an epoxy washer or any other suitable insulating substances having a low coefficient of thermal expansion. Other low expansion reinforcements such as aramid fibers do not require a nonconductive filler. The nonconductive filler of course, is for electrical insulation purposes only, with the entire circuit formed by the process being rigid.

BRIEF SUMMARY OF THE INVENTION

Flexible printed circuits and methods of fabricating and forming plated thru-holes therein are disclosed. The flexible printed circuits have one or more substantially rigid regions where plated thru-holes are to be formed, the regions being made rigid by the substitution of epoxy glass or other conventional rigid printed circuit board materials in place of the flexible material used for the flexible portions of the circuit. In this manner the thru-holes are formed through conventional printed circuit board layers, allowing plating of the thru-holes using conventional well developed techniques. This process avoids the necessity of plating thru-holes in flexible printed circuit materials currently requiring special equipment and techniques, and further avoids stress concentration at the junction between the rigid plated thru-holes and the adjacent flexible printed circuit. Various methods for forming such circuits and circuits so formed are disclosed.

BRIEF DESCRIPTION OF THE DRAWINGS

FIG. 1 is a face view of an exemplary flexible printed circuit fabricated in accordance with the present invention;

FIG. 2 is a schematic cross section of a flexible printed circuit of the same general type as illustrated in FIG. 1;

FIGS. 3-12 are views illustrating the various steps in the preferred process for fabricating a flexible printed circuit in accordance with FIGS. 1 and 2;

FIG. 13 is a cross section of a portion of a multilayer flexible printed circuit fabricated in accordance with the present invention and taken along the line 13—13 of FIG. 16;

FIG. 14 is a view illustrating the use of the present invention as a rolling loop;

FIG. 15 is a view illustrating the use of the present invention in an application having a fixed and static offset between the two ends thereof; and FIG. 16 is a face view of a multilayer flexible printed circuit illustrating the application of the concepts of the present invention to the formation of interconnects and crossovers in a multilayer flexible printed circuit assembly.

DETAILED DESCRIPTION OF THE INVENTION

Figure 9:
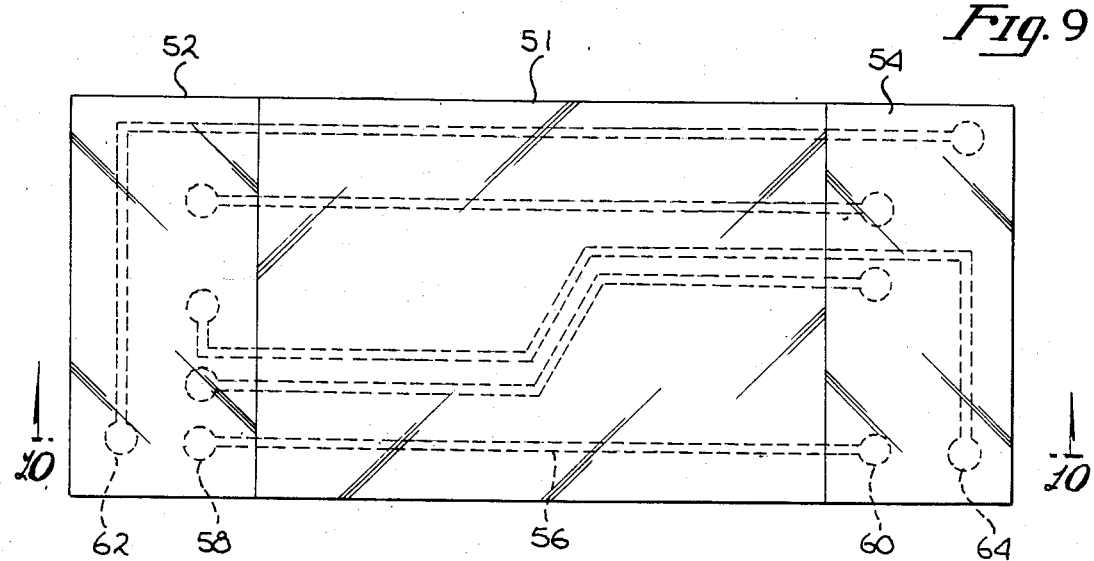

First referring to FIG. 1, a face view of an exemplary flexible printed circuit fabricated in accordance with the present invention may be seen. The printed circuit is comprised of a plurality of individual electrical conductors each extending between a respective pair of terminal pads 12 at opposite ends of the printed circuits, the pads 12 typically having plated thru-holes therethrough for soldering to connector pins or the like. The essential feature of the present invention illustrated in FIG. 1 is that the central region 14 between lines 16 and 18 is flexible, having all the characteristics and advantages of prior art flexible circuits, with the end regions 20 and 22 being rigid and formed of conventional printed circuit board materials. The advantage of this, of course, is that because the rigid portions are formed of conventional materials, conventional manufacturing techniques may be applied to the fabrication and/or finishing of these regions. Of particular importance is the ability to form plated thru-holes in these regions, such as through pads 12, to provide solder connections to the circuit component onto which the printed circuit is to be connected, and to also form plated thru-holes at other regions of the rigid printed circuit to provide cross-overs and/or interconnections between printed circuit layers in multilayer printed circuit boards.

As an additional advantage of the present invention, the rigidifying of the portions of the printed circuit to be connected to other components relieves stresses which otherwise may exist around one or more such connections. In particular, if the entire printed circuit is flexible, including those regions in which solder connections are to be made to rigid terminals, any twisting or flexing of the printed circuit will tend to concentrate the stresses arising therefrom on the closest solder connection, as the rigidity of that connection coupled with the flexibility of the circuit extending to other connections essentially prevents the communication of the load to the rest of the terminals. By rigidifying the ends (or other regions) of the flexible printed circuit where connections are to be made, the load caused by flexing or twisting of the printed circuit will be much better distributed overall, such connection thereby substantially reducing the maximum stress at any such connection. Of course, there must always be some junction between the rigid portions and the flexible portions, whether that is a very small rigid area comprising a solder pad, or a rigid area comprising an entire printed circuit region. In an embodiment such as that illustrated in FIG. 1, junctions 16 and 18 between the rigid areas and the flexible area are straight rather than curved, thereby tending to well distribute the stress of bending, twisting etc. over the entire junction, though any such junctions may be curved, even circular, depending upon the needs of any particular application, as the strength and flexibility of the materials used assures excellent strength and durability of the junction regardless of its shape.

A typical flexible printed circuit will have various layers therein having a thickness on the order of a few thousandths of an inch, will have conductive path line widths on the order of tens of thousandths of an inch, and lengths on the order of inches or even feet. Accordingly, in the remaining Figures, printed circuit patterns, cross-sections and the like are drawn out of scale for purposes of clarity so as to better illustrate the method of fabrication of the printed circuits and various features thereof. Thus, as may be seen in FIG. 2, a cross-section of a single layer flexible printed circuit in accordance with the present invention, such as the type illustrated in FIG. 1, may be seen. This exemplary cross-section illustrates a single conductor 24 extending between the two ends of the structure. The conductor 24 is sandwiched between flexible printed circuit layers 26 and 28 in the central section thereof, and between conventional rigid printed circuit board material members 30 and 32 at the ends thereof.

The flexible printed circuit board material for layers 26 and 28 may be by way of example, Kapton, although other flexible printed circuit materials may also be used as desired. The conventional rigid printed circuit board materials for regions 30 and 32 may also be any conventional rigid printed circuit board material, the preferred embodiment being a prepreg epoxy board comprising a stage B epoxy impregnated fiberglass printed circuit board substrate, used because of its ease of use, final rigidity and dimensional stability in the finished product. Structurally, the epoxy board layers 30 and 32 fuse to the adjacent ends of the flexible members 26 and 28, respectively, with the layers fusing to each other at the ends of 34 of the assembly. Laminated over layers 30 and 32 are additional layers of epoxy board 36 and 38, the inner edges of which preferably overlap the junction between flexible layers 26 and 28 and the epoxy board layers 30 and 32, respectively, to provide reinforcement for the junction therebetween. If desired an additional stress relieving filler 40 of a similar flexible resin or other material may be used as a further stress relief between the rigid portion and the flexible portion of the finished circuit.

It may be seen from FIG. 2 that when a plated thru-hole 42 is made, the plated thru-hole extends through multilayers of the assembly, all of which are comprised of conventional printed circuit board materials, specifically either epoxy board or the copper circuit itself. As such, the plated thru-hole 42 may be readily formed by drilling, providing a thin electroless copper plating in the thru-holes, and then electroplating thereover to provide the required copper buildup. As a result, the plated thru-holes may readily be formed using conventional printed circuit board fabrication techniques without the difficulties associated with the plating of flexible printed circuit materials, and without having to use any of the special processes required thereby.

The preferred method of fabricating printed circuits in accordance with the present invention is illustrated in FIGS. 3 through 12. Initially, a thin sheet of copper 44 having a size preferably somewhat larger than the finished printed circuit is provided. A piece of appropriate flexible material, Kapton precoated with an adhesive in the exemplary embodiment, is appropriately cut to span the desired flexible region of the finished circuit. This Kapton layer (FIGS. 5 and 6) is placed over the copper sheet 44, with epoxy glass prepreg members 48 and 50 being placed over the adjacent end portions of the copper sheet 44 so as to abut or substantially abut the Kapton layer 46. The resulting structure shown in FIG. 6 is then heated in a press so that the Kapton layer, precoated with an appropriate adhesive (commercially available in that form) bonds to the copper sheet, as does the epoxy glass portions. Further, prior to curing, the epoxy resin in the glass will adequately flow to provide a good bond to the edges of the Kapton, so that all members of the assembly which abut each other are bonded to each other over the respective areas of abutment. In that regard, while the edge bond between the epoxy glass regions 48 and 50 and the Kapton region 46 is not generally a high strength edge bond, it does have sufficient strength to retain the members to each other throughout the remainder of the processing steps.

The next step in the process is to etch the copper sheet 44 so as to leave the desired copper pattern as illustrated in FIGS. 7 and 8. In general, this step is accomplished in the same manner as is used in forming conventional printed circuit boards, specifically, by coating the copper layer with appropriate photo resist, exposing the photo resist and developing the photo resist. Thereafter the exposed or alternatively unexposed photo resist is dissolved away, depending upon the type of photo resist used, and the exposed areas of the copper etched away to leave the copper pattern as shown. Finally, the remaining photo resist is dissolved away.

Thereafter, the exposed copper pattern is itself covered with another layer of Kapton 51 and epoxy board 52 and 54 as shown in FIGS. 9 and 10, and again heated in a press to form the sandwich structure shown. As may be seen in these Figures, copper conductors such as conductor 56 extend to the center of the two layers of Kapton between pads 58 and 60, with additional conductors connecting other pads, such as by way of example pads 62 and 64, all of which are buried pads, buried between the two layers of epoxy board. If desired, the junction between the flexible members and the adjacent epoxy board members may be staggered to help to provide additional strength to the structure of FIGS. 9 and 10. In the preferred embodiment, additional layers of epoxy board 66, 68, 70 and 72 (FIGS. 11 and 12) are laminated over the structure of FIGS. 10 and 11, either as part of the same lamination step just described, or alternatively as a separate lamination step. As may be seen in FIG. 12, these layers 66, 68, 70 and 72 are preferably staggered with respect to the junction between the flexible layers and the edgewise adjacent epoxy board layers so as to themselves provide both greater rigidity to the end regions and to stress relieve th edge joint between the flexible regions and the edgewise adjacent epoxy boards. Finally in FIG. 12, the plated thru-holes 74, 76, 78 and 80 making electrical contact to the buried copper pads 62, 68, 60 and 64, respectively, are drilled and plated as hereinbefore described. In a typical assembly, the various layers are aligned by appropriate reference marks falling outside the area of the finished flexible printed circuit assembly, with the reference marks being removed when the final assembly is trimmed to size.

Figure 10:
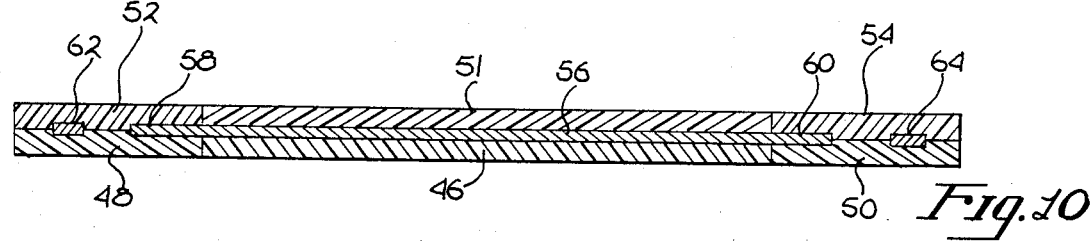
Figure 11:
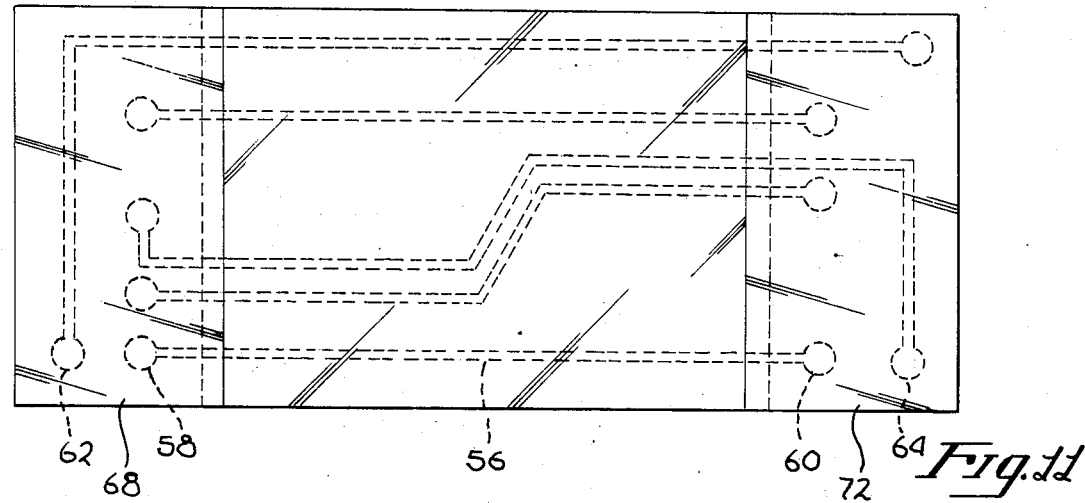
Figure 12:
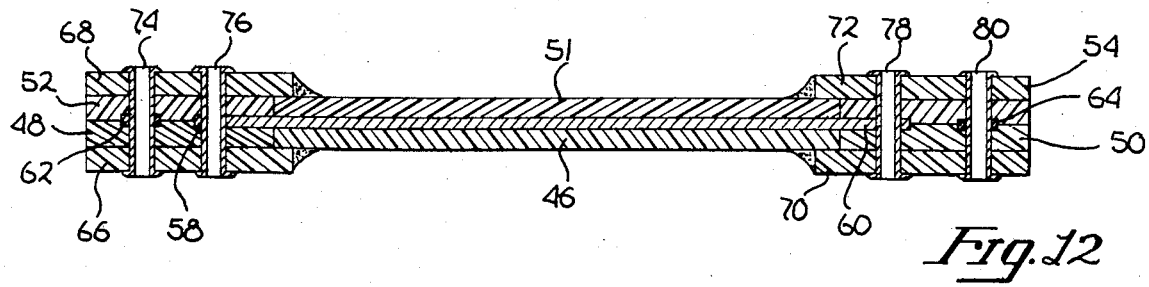

Now referring to FIGS. 13 and 16, additional aspects and features of the present invention may be seen. In particular, FIG. 16 presents a top view of a multilayer flexible printed circuit, the same circuit being shown in cross-section in FIG. 13. In the preferred multilayer form, two or more structures generally similar to that illustrated with respect to FIG. 10 are laminated together with outer layers 82 and 84 of epoxy board, as well as being separated by intermediate layer or layers 86, also of epoxy board, so that as before the rigid portions are formed entirely of conventional printed circuit board materials. (In some applications, the intermediate layers 86 will not be used, particularly in a circuit having many layers, to avoid unnecessary thickness accumulation in the rigid areas.) Also as illustrated in FIG. 13, preferably each flexible printed circuit region comprising a sandwich of the printed circuit with a layer of flexible material on each side thereof is not bonded to the adjacent sandwich, thereby maintaining maximum flexibility of the flexible portions of the finished assembly. (Obviously, in those applications where very limited flexibility is needed, two or more such layers may be bonded as desired.)

Referring again to FIG. 16, it will be noted conductive pad 88, visible also in FIG. 13, is integrally connected with conductor 90 extending across the flexible portion of the printed circuit. In addition, a second pad 92 is provided which pad allows the interconnecting of that layer of the printed circuit with a pad 94 of a second printed circuit layer therebelow. As may be seen in FIG. 13, to provide this interconnect, a plated thru-hole is provided through pads 92 and 94 to provide electrical connection therebetween. Thus, in flexible printed circuits wherein cross-overs are required, in accordance with the present invention, the circuit is preferably laid out so that the cross-overs may be formed not in the flexible portion or in any rigid portion formed in part by layers of the flexible printed circuit, but rather in the rigid portion as formed entirely of conventional printed circuit board materials, again facilitating the formation of plated thru-holes using conventional processing and yielding high reliability interconnects.

The flexible printed circuit of FIG. 13 is suitable for various applications such as by way of example the formation of rolling loops as illustrated in FIG. 14. Obviously in cases where some rigid portions of the circuit are to be installed at an angle to each other, the various layers in a multilayer flexible printed circuit may have slightly different lengths to accommodate the different radii of curvature in the area of the bend. In that regard, it should be noted that the exemplary printed circuits shown herein show or suggest that the "ends" of the flexible circuits be made rigid, though the word ends as used herein is used in a relative sense in that any flexible printed circuit board assembly may have the rigid regions formed other than that the physical ends of the structure, and in many cases may have more than two rigid regions either connected to a single flexible portion and/or separating flexible portions, as it is not uncommon to use a flexible printed circuit, by way of example, to interconnect with more than two electronic modules in an overall system.

The preferred embodiments of the invention described herein have been described with respect to the use of a copper sheet as one of the starting materials, which of course results in a patterned copper layer or layers for the conductive portion of the printed circuit. While copper is the most common material used for printed circuits in general, it should be noted that other materials may also be used as desired. By way of specific example, one might use nickel instead of copper, as nickel may be readily etched and plated by electroless and electroplating techniques and may have some advantages in specific applications. Also, in addition to other metals and metal alloys, one could also use printed circuit layers formed by thin or thick film techniques. In such a case, by way of example, one might provide adjacent pieces of rigid and flexible material and edge bond these pieces by pressing and heating the pieces. Thereafter a conductive thick film layer could be put down on the resulting sheet by printing through a mask or by silk-screening techniques, and cured to form the structure shown in FIGS. 7 and 8. Techniques for putting down thin film and thick film circuit patterns are well known and need not be described in great detail herein. Of particular importance to the present invention is the fact that many thin film and thick film materials are readily electroplatable and accordingly the processing from the structure of FIGS. 7 and 8 may proceed in the same manner as hereinbefore described. Thus, while the present invention has been disclosed and described herein with respect to certain specific exemplary structures and methods, it will be understood by those skilled in the area that various changes in form and detail may be made therein without departing from the spirit and scope of the invention.

I claim:

1. In a flexible printed circuit, the improvement comprising at least one electrical circuit, at least part of which defines a circuit area and is formed as a patterned electrically conductive layer having first and second opposite surfaces, a first sheet of flexible electrically insulative material bonded to said first surface of said electircal circuit over a first portion of said circuit area less than the entire circuit area leaving a second portion of said circuit area on said first surface uncovered by said first sheet of flexible material, said first flexible sheet having an edge difining a boundary of said first portion of said circuit area on said first surface, a second sheet of flexible electrically insulative material bonded to said second surface of said electrical circuit over a third portion of said circuit area less than the entire circuit area leaving a fourth portion of said circuit area on said second surface uncovered by said second sheet of flexible material, said second flexible sheet having an edge defining a boundary of said third portion of said circuit area on said second surface and being bonded to the adjacent surface of said first sheet of flexible material, a first sheet of rigid printed circuit board substrate bonded to said first surface of said electrical circuit adjacent said first flexible sheet over said second portion of said circuit area, said first rigid sheet having an edge abutting the edge of the adjacent first flexible sheet, and a second sheet of rigid printed circuit board substrate bonded to said second surface of said electrical circuit adjacent said second flexible sheet over said fourth portion of said circuit area, said second rigid sheet having an edge abutting the edge of the adjacent second flexible sheet, whereby said second and fourth portions of the circuit area of the printed circuit do not include any layers of the first and second flexible sheets therein, thereby facilitating the forming of plated thru-holes in said second and fourth portions of the circuit area by conventional techniques.

2. The improvement of claim 1 further comprised of third and fourth sheets of rigid printed circuit board substrate bonded to said first and second sheets of rigid printed circuit board material, with an edge region of said third and fourth sheets of rigid printed circuit board material overlying and being bonded to the adjacent edge region of said first and second sheets of flexible material, whereby said third and fourth sheets of rigid printed circuit board material reinforce the joints between the first and second sheets of flexible material and the first and second sheets of rigid printed circuit board substrate.

3. The improvement of claim 2 wherein the adjacent edges of said first, second, third and fourth sheets of rigid printed circuit board substrate and said first and second sheets of flexible material are substantially straight.

4. The improvement of claim 2 wherein said first, second, third and fourth sheets of rigid printed circuit board substrate and said first and second sheets of flexible material are of substantially the same thickness.

5. The improvement of claim 1 further comprised of at least one thru-hole through said first and second sheets of rigid printed circuit board substrate and through part of said electrical circuit, said thru-hole being plated so as to make electrical contact with the respective part of said electrical circuit.

6. In a multilayer flexible printed circuit, the improvement comprising a plurality of circuit elements, each comprising at least one electrical circuit, at least part of which defines a circuit area and is formed as a patterned electrically conductive layer having first and second opposite surfaces, a first sheet of flexible electrically insulative material bonded to said first surface of said electrical circuit over a first portion of said circuit area on said first surface less than the entire circuit area leaving a second portion of said circuit area on said first surface uncovered by said first sheet of flexible material, said first flexible sheet having an edge defining a boundary of said first portion of said circuit area on said first surface, a second sheet of flexible electrically insulative material bonded to said second surface of said electrical circuit over a third portion of said circuit area on said second surface less than the entire circuit area leaving a fourth portion of said circuit area on said second surface uncovered by said second sheet of flexible material, said second flexible sheet having an edge defining a boundary of said third portion of said circuit area on said second surface and being bonded to the adjacent surface of said first sheet of flexible material, a first sheet of rigid printed circuit board substrate bonded to said first surface of said electrical circuit adjacent said first flexible sheet over said second portion of said circuit area, said first rigid sheet having an edge abutting the edge of the adjacent first flexible sheet, and a second sheet of rigid printed circuit board substrate bonded to said second surface of said electrical circuit adjacent said second flexible sheet over said fourth portion of said circuit area, said second rigid sheet having an edge abutting the edge of the adjacent second flexible sheet, whereby said second and fourth portions of the circuit area of the printed circuit do not include any layers of the first and second flexible sheets therein, thereby facilitating the forming of plated thru-holes in said second and fourth portions of the circuit area by conventional techniques, said plurality of circuit elements being bonded together in a stack through the sheets of rigid printed circuit board substrates thereof.

7. The improvement of claim 6, wherein each of said first flexible sheets and said first rigid sheets are of substantially the same thickness, each circuit element further comprising a third sheet of rigid printed circuit board substrate bonded to and disposed in overlaying relation to the abutting edges of the first flexible sheet and the first rigid sheet.

8. The improvement of claim 7, wherein each of said second flexible sheets and said second rigid sheets are of substantially the same thickness, each circuit element further comprising a fourth sheet of rigid printed circuit board substrate bonded to and disposed in overlying relation to the abutting edges of the second flexible sheet and the second rigid sheet.

9. The improvement according to claim 6 wherein the first and second portions of the circuit area on the first surface of each circuit element are coextensive with the respective third and fourth portions of the circuit area on the second surface of each circuit element.

10. The improvement of claim 6, including at least one plated thru-hole in said stack of sheets of rigid printed circuit board substrate.

11. The improvement of claim 6 wherein said plurality of circuit elements is bonded together in a stack through the rigid printed circuit board substrates with an intermediate rigid printed circuit board substrate between the rigid printed circuit board substrates of each said pair of adjacent circuit elements.

12. The improvement of claim 11 wherein said intermediate rigid printed circuit board substrates overlap the region of abutment of the rigid printed circuit board substrates and the flexible electrically insulative material of the adjacent circuit elements, thereby reinforcing the junction therebetween.

13. The improvement of claim 12 further comprised of top and bottom sheets of rigid printed circuit board substrate bonded to the sheets of rigid printed circuit board material at the top and bottom of the stack of circuit elements with an edge region of said top and bottom sheets of rigid printed circuit board material overlying and being bonded to the adjacent edge region of said first and second sheets of flexible material of the adjacent circuit element whereby said top and bottom sheets of rigid printed circuit board material reinforce the joints between the first and second sheets of flexible material and the first and second sheets of rigid printed circuit board substrate in the adjacent circuit elements.

14. The improvement of claim 1, wherein said first flexible sheet and said first rigid sheet are of substantially the same thickness and further comprising a third sheet of rigid printed circuit board substrate bonded to and disposed in overlying relation to the abutting edges of the first flexible sheet and the first rigid sheet.

15. The improvement of claim 14, wherein said second flexible sheet and said second rigid sheet are of substantially the same thickness and further comprising a fourth sheet of rigid printed circuit board substrate bonded to and disposed in overlying relation to the abutting edges of the second flexible sheet and the second rigid sheet.

16. The improvement according to claim 1 wherein the abutting edges of the first and second flexible sheets and the first and second rigid sheets lie in a common plane perpendicular to the plane of said sheets.

17. The improvement according to claim 1 wherein the first and second portions of the circuit area on the first surface are coextensive with the respective third and fourth portions of the circuit area on the second surface.

18. A flexible printed circuit comprising at least one electrical circuit, at least part of which defines a circuit area and is formed as a patterned electrically conductive layer having a first surface, a sheet of flexible electrically insulative material bonded to said first surface of said electrical circuit over a first portion of said circuit area on said first surface less than the entire circuit area leaving a second portion of said circuit area on said first surface uncovered by said sheet of flexible material, said flexible sheet having an edge defining a boundary of said first portion of said circuit area on said first surface, a sheet of rigid printed circuit board substrate bonded to said first surface of said electrical circuit adjacent said flexible sheet over said second portion of said circuit area, said rigid sheet having an edge abutting the edge of the adjacent flexible sheet whereby said second portion of the circuit area of the printed circuit does not include any layer of the flexible sheet therein, thereby facilitating the forming of plated thru-holes in said second portion of the circuit area by conventional techniques.

19. The flexible printed circuit of claim 18 including at least one plated thru-hole in said sheet of rigid printed circuit board substrate.

20. The flexible printed circuit of claim 18 wherein said sheet of flexible material leaves a third portion of the circuit area uncovered, said flexible sheet having a further edge defining a further boundary of said first portion of said circuit area on said first surface and a further sheet of rigid printed circuit board substrate bonded to said first surface of said electrical circuit adjacent said flexible sheet over said third portion of said circuit area, said further rigid sheet having an edge abutting the further edge of the adjacent flexible sheet whereby said third portion of the circuit area of the printed circuit does not include any layer of the flexible sheet therein, thereby facilitating the forming of plated thru-holes in said third portion of the circuit area by conventional techniques.

* * * * *